United States Patent
Dick et al.

(10) Patent No.: US 6,177,680 B1
(45) Date of Patent: Jan. 23, 2001

(54) CORRECTION OF PATTERN-DEPENDENT ERRORS IN A PARTICLE BEAM LITHOGRAPHY SYSTEM

(75) Inventors: Gregory J. Dick, Beacon, NY (US); Abigail S. Ganong, Sherman, CT (US); John George Hartley, Fishkill, NY (US); John W. Pavick, Lagrangeville, NY (US); Denise M. Puisto, Milton, VT (US)

(73) Assignee: International Business Machines Corporation, Armonk, NY (US)

( * ) Notice: Under 35 U.S.C. 154(b), the term of this patent shall be extended for 0 days.

(21) Appl. No.: 09/197,167

(22) Filed: Nov. 20, 1998

(51) Int. Cl.[7] .......................... H01J 37/302; G05B 19/18
(52) U.S. Cl. .................. 250/492.22; 250/492.2; 250/492.3; 430/296
(58) Field of Search .................. 250/492.22, 492.2, 250/492.3; 430/296

(56) References Cited

U.S. PATENT DOCUMENTS

| | | | |
|---|---|---|---|
| 5,159,201 | * 10/1992 | Frei | 250/492.2 |
| 5,446,649 | * 8/1995 | Keum | 364/167.01 |
| 5,837,423 | * 11/1998 | Okamoto | 430/296 |

* cited by examiner

Primary Examiner—Bruce C. Anderson
Assistant Examiner—Nikita Wells

(57) ABSTRACT

An e-beam system for making masks corrects the beam for pattern-dependent errors by executing the bulk of the post-processing program only once, with two sets of output data being generated by the encode routine. A first output file of the encode routine generates the beam control data without pattern-dependent corrections. A second output file merges the beam control data with the data for metrology marks. A test wafer is patterned using the second output file and measured to generate a set of pattern correction data. Production wafers are written using the beam control data corrected on the fly by the pattern correction data.

12 Claims, 2 Drawing Sheets

CORRECTION OF PATTERN-DEPENDENT ERRORS IN A PARTICLE BEAM LITHOGRAPHY SYSTEM

FIELD OF THE INVENTION

This invention relates to electron beam (in general, particle beam) lithography used in semiconductor manufacturing. More particularly, it relates to a technique for reducing the amount of computer time and resources used in converting from the geometric data describing the various shapes on a mask or other workpiece, e.g. a wafer, to the signals to lens coils and deflectors that will write those shapes on the photoresist.

BACKGROUND OF THE INVENTION

It is known in the art, as described e.g. in U.S. Pat. No. 5,424,548, that an e-beam system must be corrected for systematic or constant errors that arise because of various non-linearities in the system. For example, FIG. 1 shows in highly simplified form, an e-beam system in which a wafer 30 has a pattern being written on a field (or small portion) 31. FIG. 2 shows the wafer in more detail as being divided up into a set of fields 31. A field represents the deflection range of the beam. Mechanical motion of the stage is used to move from one field to another. Those skilled in the art will be aware that distortions will increase non-linearly as the distance from the system axis increases and fields 31 at the edge of the wafer will have more distortion than those close in. Within a field, distortions also increase as the beam deflection increases.

It is standard practice to make a calibration wafer by writing a stock pattern, such as that shown in FIG. 3, measuring the wafer after transferring the pattern to the wafer, and generating an algorithm to convert the nominal data (if the fields in the system were perfect) to corrected data. Such corrected data will be referred to as global correction data and will depend on system distortions, not on the density or other features of the pattern being written. Conventional measuring systems, such as the LMS 2000 by the Leica company are commercially available to perform the measurement. Those skilled in the art will be aware that there is another class of errors that vary from one mask to another and that depend on at least the density of lines within a field 31.

The cited patent discloses an approach to correcting such errors by adding metrology features or marks, such as those shown in FIG. 3, in vacant portions of the particular mask in question. Thus, the distortions in the metrology marks located within the nth field (31n) will depend on the mask pattern in that field 31n. A sacrificial calibration wafer is made up containing the metrology marks and is discarded after the measurements for correction have been made.

As the art has progressed, the requirements for distortion correction have become more stringent and the density of features has increased, so that the previous method is no longer sufficient.

The previous method, moreover, not only made a sacrificial mask that was discarded, it also required two computer runs to generate the e-beam control data for the two masks. The computer resources used in the "post-processing" programs used to generate the e-beam data are non trivial. For example post processing for a complex state of the art microprocessor can take tens of hours on a powerful machine such as an IBM R/S 6000 mod 595. Since mask shops make masks in only small quantities, this expense cannot be spread over a lengthy production run and has a significant effect on the shop's costs.

Thus, the field of mask making has sought an economical method for obtaining pattern-dependent corrections. The field has also sought a method of reducing turn-around time in mask fabrication by reducing post-processing time.

SUMMARY OF THE INVENTION

The invention relates to a method of generating and applying correction signals to correct for pattern-dependent errors in an e-beam system, in which the post-processing computer program that converts from geometric data (referred to as input design data) to beam control data that are used to generate control signals for the various system elements (lenses, deflectors, etc) outputs two sets of beam control data in a single pass through the geometric input design data. The first set of beam control data may optionally contain systematic (non pattern-dependent) corrections, but does not contain pattern-dependent corrections. The second set of beam control data (referred to as an intermediate set of beam control data) is used to make a calibration mask and contains data that will produce metrology marks (metrology beam control data) that have been substituted for the circuit (or pattern) beam control data that produce the correct portion of the pattern for that set of locations.

The two sets of output signals are stored. The intermediate set of beam control data is used to form a calibration wafer containing the added metrology marks in place of corresponding pattern elements. These metrology marks are measured to produce correction data that are pattern-dependent and influenced by the size, shape, etc. of the nearby pattern elements.

In the fabrication of production masks, the (uncorrected) set of beam control data is read from storage and the stored control signals in the beam control data are corrected by the correction data to generate the final beam control data that are used to write the mask.

DESCRIPTION OF THE PREFERRED EMBODIMENT

Figure 1:
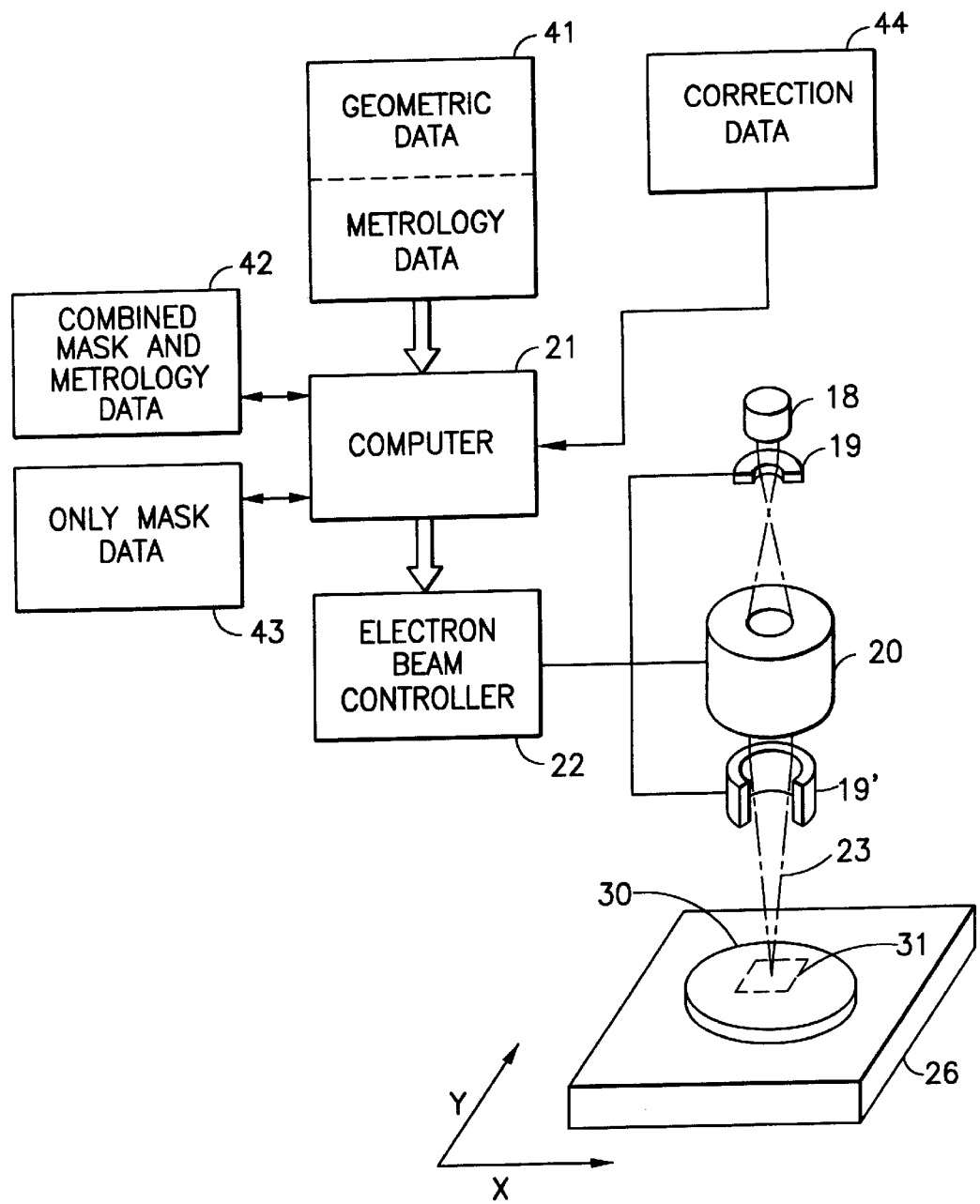
FIG. 1 illustrates, in partially pictorial, partially schematic form a system used for the practice of the invention.
Figure 2:
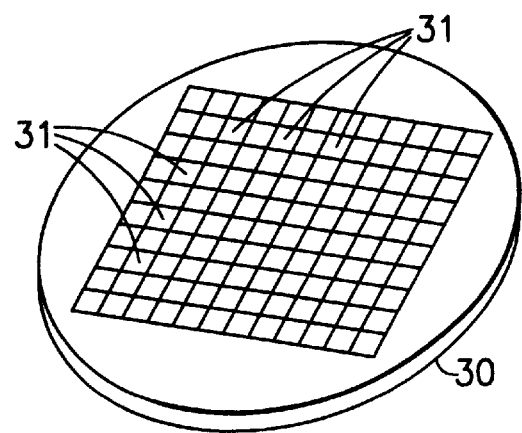
FIG. 2 illustrates a mask divided into fields.
Figure 3:
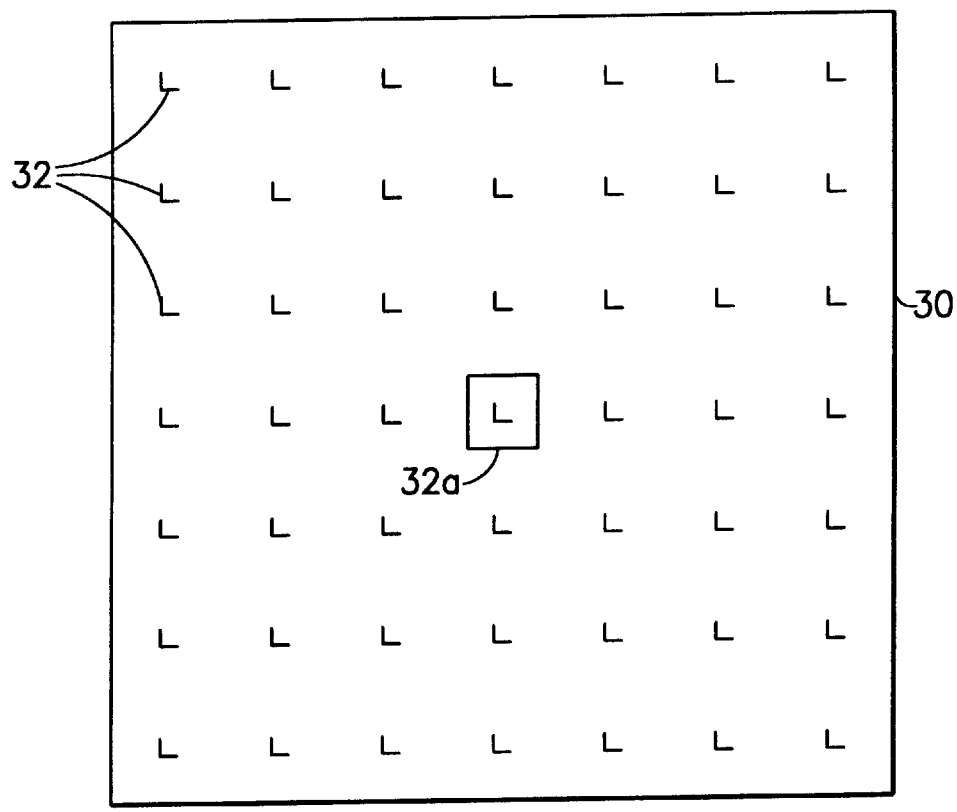
FIG. 3 illustrates a typical pattern of metrology marks within a field.

FIG. 1 shows in simplified form, an e-beam system for use with the invention. At the top center, gun 18 generates a beam that is directed downward along a system axis and focused and/or deflected by elements 19, 19' and 20. Illustratively, the upper element (lens) 19 will collimate the beam and the lower lens 19' will focus it on the workpiece 30. Workpiece 30 is illustratively a mask, though the system can also be used for direct-write operations in which a pattern is written directly on a wafer or other workpiece, as in micromachining. As is well known in the art, a radiation sensitive layer (photoresist) is exposed by the beam. The photoresist is developed and the pattern is transferred to the workpiece by etching (or other conventional processes such as ion implanting or deposition). In operation, deflection element 20 will deflect the beam along orthogonal coordinates illustrated in the lower left of the figure and within the bounds of a field 31, shown with dotted lines.

Those skilled in the art will be aware that stage 26, supporting mask 30, is controlled by a computer 21 to move consecutive fields 31 under the operating range of the beam.

At the upper left of the figure, there is shown a group of boxes that represent the pattern data at various stages of operation of the system. An initial set of data is stored in box 41 in geometric form; i.e. the schematic of the particular circuit in question has been "laid out" in a series of geometric shapes such as rectangles and lines and a set of mask patterns representing the corresponding geometric shapes of the several layers that form an integrated circuit have also been formed. These are conventional operations, well known to those skilled in the art, and are not part of the subject invention. The data so generated will be referred to as "input design data" and will depend on the semiconductor process and lithography being used.

Computer 21, illustratively an IBM R/S 6000, operates on the geometric input design data to perform a "post-processing" program, such as that described in U.S. Pat. No. 5,294,800. A post processing program performs five basic operations on the geometric data to convert it to the control data. The operations are: union, fill, gray, proximity and encode.

Union (or overlap removal) is the removal of all overlap between shapes. This is used in shaped beam systems, in which the system generates rectangles of varying shape that are combined to make up the geometric data.

Fill (also known as fracturing) is the process of covering the input design data with appropriately sized rectangles. For example, a diagonal line will be approximated by a "staircase" of rectangles.

Gray (or gray-splicing) involves insuring that shapes that span fields stay connected; i.e. that they do not pull apart. Typically, when a line crosses a field boundary, a small segment is double exposed with a fractional dose with each of the adjoining fields delivering a portion.

Proximity correction involves modifying the dose (number of electrons) for each rectangle from the nominal dose based on the type and distance of neighboring shapes.

Encode involves creating tool-specific control data, referred to as beam control data. For example, in a particular case where a thin line is to be generated and then directed at a certain x-y location within a field, the beam control data will include the numerical values representing the currents and voltages to deflect the initially square beam with respect to an aperture to block most of the initial beam and permit the electrons forming the desired shape to pass through. The values at this stage are conventionally not the value of a current in amperes, but the numerical value that is fed into the coil driving circuit to generate the desired number of amperes. Having generated the rectangular block, further currents and voltages are passed to coils and electrostatic deflectors to direct the electrons to the right place. The terminology used here is that "data" is the generic term, which may be represented in various formats. For example, a rectangle could be represented by the x,y location of the lower left corner, followed by the length along the x and y axes, or by any of a number of other representations. Similarly, a current for a coil may be represented by a numerical value that computer 21 will send to a current driver to send the required current through the coil.

The first four steps consume the bulk of computer time during the post-process operation and, according to the invention, are performed only once. This is in contrast to the prior art, in which the entire post-processing program was run twice. According to the invention, the encode step is performed twice, with and without the metrology marks. A stored file within box 41 contains the locations on the workpiece where the metrology marks are to go and also the data to generate the metrology mark or marks. When a location in an area reserved for a metrology mark is encountered, the computer processes the data as usual for the "beam control" data stream (storing it in the location represented by box 42 in FIG. 1) and, for an "intermediate beam control" data stream, substitutes the metrology mark data for the pattern data, (storing the output in the location represented by box 43 in FIG. 1). The output from the post-processor is thus two files, the beam control file containing a set of uncorrected beam control data and the intermediate beam control file containing a set of intermediate beam control data.

Thus, the intermediate beam control data contains two subsets: the first subset is identical to the mask pattern data at corresponding non-metrology locations and the second subset consists of metrology beam control data that specify metrology marks.

In operation, the post-processing program steps sequentially though the geometric data in any convenient sequence, e.g. a field or subfield at a time.

As it does so, it checks the x-y location where that shape is meant to go on the workpiece. When it comes to an nth member of the set of geometrical data that is in a location reserved for a metrology control mark, it substitutes the stored data for an ith member of a stored set of metrology beam control data. A member of a set will typically be a vector or other ordered group of numbers, such as voltages and currents for the beam control elements in the system. The value of i could be one, when all the metrology marks are the same, or it could be any convenient value if different metrology marks are desired. The process of forming final and intermediate beam control data files is illustrated in pseudo-code format in Table I.

The intermediate beam control data is used to form a calibration wafer containing as many calibration marks in an nth field as are called for. The density of metrology control marks may vary within a field. The distribution of marks within fields and over the surface of a wafer will depend on the usual engineering tradeoffs and on the distortions of the particular system in question. One mark at the center of the field is sufficient for translation, while a mark near each corner of the field allows for the inclusion of first order field distortion.

TABLE I

Preliminary Steps

Arrange design data to form a set of input design data.
Set up an array of metrology design data.
Post-Processing Perform conventional union, fill, gray-splicing and proximity correction steps.
Then, for the encode step:
Read in the nth vector of the input design data
Generate an nth vector of beam control data;
IF the nth vector of the input design data is in a location reserved for a metrology mark,
THEN copy the corresponding vector of metrology data to the intermediate beam control data file and copy the nth vector of beam control data to the final beam control data file,
ELSE copy the nth vector of beam control data to both the intermediate and final beam control data files.
Return to read the (n + 1)th vector of the input design data.

TABLE I-continued

Calibration

Pattern and develop a test wafer with metrology data.
Measure the test wafer and generate correction coefficients for each field on the workpiece.

Production

Read the beam control data and correction coefficients.
Correct the beam control data and write the corrected pattern.
Transfer the corrected pattern to the workpiece.

The calibration wafer is processed and measured. The measured metrology data resulting from the measurement represents the deviation between the desired location of the set of metrology marks and their actual location. Illustratively, for the nth field, an equation of the form:

$$I_n = I'_n + a_n x + b_n y,$$

is used, where $I_n$ is a representation of the final current sent to a coil, $I'_n$ is the uncorrected value for the file in box 42, $a_n$ and $b_n$ represent coefficients (derived from the measured metrology data by any convenient method such as least squares fitting) that depend on the nth field, and x and y are coordinates relative to some reference point of the nth field. The coefficients $a_n$ and $b_n$ (referred to as pattern correction data) may be illustratively generated by comparing the measured locations with the ideal location and then performing the same conversion from x-y location data to currents that are done for the final beam control data. The result is then stored in box 44 in FIG. 1. When the mask is written, the data from box 43 and the correction data from box 44 are merged on the fly according to the algorithm above and the resultant value (referred to as a corrected element of the beam control data) is sent to the driver circuit. Those skilled in the art will be aware that there are many other types of corrections, such as a global set of coefficients, a lookup table in which the correction is uniform for a given field, higher order equations, etc. A similar procedure is followed for the voltages sent to electrostatic deflectors. Some elements may need to be corrected much more than others, of course, and the number of corrections to be applied will vary from one system to another and, for a given system, from one field to another.

While the invention has been described in terms of a single preferred embodiment, those skilled in the art will be aware that different alternative methods may be performed within the scope of the following claims, such as storing the corrected final data, in the case where a number of identical masks or other workpieces are to be made. Although electrons are the preferred particle type, other particles such as ions may also be used. The boxes in FIG. 1 for storing data may represent a disk, a tape drive, nonvolatile memory or any other convenient storage means.

We claim:

1. A method of forming, in a particle beam system, a mask for integrated circuit fabrication by operating on a set of input design data to produce a set of beam control data comprising the steps of:

generating, in a data processing operation and in response to a first member of said set of input design data, a corresponding first member of said set of beam control data;

sequentially repeating said step of generating until all members of said set of beam control data have been generated; and writing a mask pattern on a mask blank by directing said particle beam at said mask blank in accordance with said set of beam control data and transferring said mask pattern to said mask blank, further comprising the steps of:

generating, in said data processing operation, an intermediate set of beam control data comprising a first subset containing corresponding members of said set of beam control data and a second subset comprising metrology beam control data;

detecting when a location of an nth member of said set of input design data is within an area reserved for a metrology feature and substituting, in said intermediate set of beam control data, a corresponding member of a stored set of metrology beam control data for an nth member of said set of beam control data corresponding to said nth member of said set of input design data, whereby said intermediate set of beam control data comprises said first subset, comprising corresponding members of said set of beam control data, and said second subset, comprising corresponding members of said stored set of metrology beam control data;

storing both said set of beam control data and said intermediate set of beam control data;

writing a calibration pattern on a calibration mask blank by directing said particle beam at said calibration mask blank in accordance with said intermediate set of beam control data and transferring said calibration pattern to said calibration mask blank;

measuring metrology features on said calibration mask blank to form a set of measured metrology data, forming a set of pattern correction data from said set of measured metrology data;

writing a corrected mask pattern on a mask blank by directing said particle beam at said mask blank, in accordance with said set of beam control data corrected by said set of pattern correction data, and;

transferring said corrected mask pattern to said mask blank.

2. A method according to claim 1, further including the step of correcting said members of said set of beam control data for non pattern dependent distortions in said particle beam system with stored members of a set of global correction data.

3. A method according to claim 1, further including the step of storing said pattern correction data and, during said step of writing said corrected mask pattern, correcting said beam control data by sequentially fetching an element of said beam control data associated with a particular location on said mask blank from storage, fetching corresponding pattern correction data associated with said particular location on said mask blank from storage, combining said beam control data associated with a particular location on said mask blank with corresponding pattern correction data associated with said particular location on said mask blank to form a corrected element of said beam control data and directing said particle beam at said mask blank in accordance with said corrected element of said beam control data.

4. A method according to claim 1, further including the step of storing said pattern correction data and, before said step of writing said corrected mask pattern, correcting said beam control data by sequentially fetching an element of said beam control data associated with a particular location on said mask blank from storage, fetching corresponding pattern correction data associated with said particular location on said mask blank from storage, combining said beam control data associated with a particular location on said mask blank with corresponding pattern correction data associated with said particular location on said mask blank to form a corrected element of said beam control data, storing said corrected element of said beam control data, thereby forming a stored set of corrected beam data, and writing said corrected mask pattern on a mask blank by directing said particle beam at said mask blank in accordance with said stored set of corrected beam control data.

5. A method according to claim 2, further including the step of storing said pattern correction data and, during said step of writing said corrected mask pattern, correcting said beam control data by sequentially fetching an element of said beam control data associated with a particular location on said mask blank from storage, fetching corresponding pattern correction data associated with said particular location on said mask blank from storage, combining said beam control data associated with a particular location on said mask blank with corresponding pattern correction data associated with said particular location on said mask blank to form a corrected element of said beam control data and directing said particle beam at said mask blank in accordance with said corrected element of said beam control data.

6. A method according to claim 2, further including the step of storing said pattern correction data and, before said step of writing said corrected mask pattern, correcting said beam control data by sequentially fetching an element of said beam control data associated with a particular location on said mask blank from storage, fetching corresponding pattern correction data associated with said particular location on said mask blank from storage, combining said beam control data associated with a particular location on said mask blank with corresponding pattern correction data associated with said particular location on said mask blank to form a corrected element of said beam control data, storing said corrected element of said beam control data, thereby forming a stored set of corrected beam control data, and writing said corrected mask pattern on a mask blank by directing said particle beam at said mask blank in accordance with said stored set of corrected beam control data.

7. A method of forming, in a particle beam system, a pattern on a workpiece by operating on a set of input design data to produce a set of beam control data comprising the steps of:

generating, in a data processing operation and in response to a first member of said set of input design data, a corresponding first member of said set of beam control data;

sequentially repeating said step of generating until all members of said set of beam control data have been generated; and writing a pattern on a workpiece by directing said particle beam at said workpiece in accordance with said set of beam control data and transferring said pattern to said workpiece, further comprising the steps of:

generating, in said data processing operation, an intermediate set of beam control data containing a first subset comprising corresponding members of said set of beam control data and a second subset comprising metrology beam control data;

detecting when a location of an nth member of said set of input design data is within an area reserved for a metrology feature and substituting, in said intermediate set of beam control data, an ith corresponding member of a stored set of metrology beam control data for an nth member of said set of beam control data corresponding to said nth member of said set of input design data, whereby the remainder of said intermediate set of beam control data forms a second subset of metrology beam control data;

storing both said set of beam control data and said intermediate set of beam control data;

writing a calibration pattern on a calibration workpiece by directing said particle beam at said calibration workpiece in accordance with said intermediate set of beam control data and transferring said calibration pattern to said calibration workpiece;

measuring metrology features on said calibration workpiece to form a set of measured metrology data, forming a set of pattern correction data from said set of measured metrology data;

writing a corrected pattern on a workpiece by directing said particle beam at said workpiece in accordance with said set of beam control data, corrected by said set of pattern correction data, and;

transferring said corrected pattern to said workpiece.

8. A method according to claim 7, further including the step of correcting said members of said set of beam control data for non pattern dependent distortions in said particle beam system with stored members of a set of global correction data.

9. A method according to claim 7, further including the step of storing said pattern correction data and, during said step of writing said corrected pattern, correcting said beam control data by sequentially fetching an element of said beam control data associated with a particular location on said workpiece from storage, fetching corresponding pattern correction data associated with said particular location on said workpiece from storage, combining said beam control data associated with a particular location on said workpiece with corresponding pattern correction data associated with said particular location on said workpiece to form a corrected element of said beam control data and directing said particle beam at said workpiece in accordance with said corrected element of said beam control data.

10. A method according to claim 7, further including the step of storing said pattern correction data and, before said step of writing said corrected pattern, correcting said beam control data by sequentially fetching an element of said beam control data associated with a particular location on said workpiece from storage, fetching corresponding pattern correction data associated with said particular location on said workpiece from storage, combining said beam control data associated with a particular location on said workpiece with corresponding pattern correction data associated with said particular location on said workpiece to form a corrected element of said beam control data, storing said corrected element of said beam control data, thereby forming a stored set of corrected beam data, and writing said corrected pattern on said workpiece by directing said particle beam at said workpiece in accordance with said stored set of corrected beam control data.

11. A method according to claim 8, further including the step of storing said pattern correction data and, during said step of writing said corrected pattern, correcting said beam control data by sequentially fetching an element of said beam control data associated with a particular location on said workpiece from storage, fetching corresponding pattern correction data associated with said particular location on said workpiece from storage, combining said beam control data associated with a particular location on said workpiece with corresponding pattern correction data associated with said particular location on said workpiece to form a corrected element of said beam control data and directing said particle beam at said workpiece in accordance with said corrected element of said beam control data.

12. A method according to claim 8, further including the step of storing said pattern correction data and, before said step of writing said corrected pattern, correcting said beam control data by sequentially fetching an element of said beam control data associated with a particular location on said workpiece from storage, fetching corresponding pattern correction data associated with said particular location on said workpiece from storage, combining said beam control data associated with a particular location on said workpiece with corresponding pattern correction data associated with said particular location on said workpiece to form a corrected element of said beam control data, storing said corrected element of said beam control data, thereby forming a stored set of corrected beam data, and writing said corrected pattern on a workpiece by directing said particle beam at said workpiece in accordance with said corrected element of said stored set of corrected beam control data.

* * * * *